United States Patent
Chen et al.

(10) Patent No.: US 10,720,499 B2
(45) Date of Patent: Jul. 21, 2020

(54) SEMICONDUCTOR DEVICE HAVING POLYSILICON FIELD PLATE FOR POWER MOSFETS

(71) Applicant: TEXAS INSTRUMENTS INCORPORATED, Dallas, TX (US)

(72) Inventors: Ya ping Chen, Chengdu (CN); Hong Yang, Richardson, TX (US); Peng Li, Chengdu (CN); Seetharaman Sridhar, Richardson, TX (US); Yunlong Liu, Chengdu (CN); Rui Liu, Changdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/042,834

(22) Filed: Jul. 23, 2018

(65) Prior Publication Data
US 2019/0296115 A1    Sep. 26, 2019

Related U.S. Application Data

(63) Continuation of application No. PCT/CN2018/079803, filed on Mar. 21, 2018.

(51) Int. Cl.
*H01L 29/40* (2006.01)
*H01L 29/78* (2006.01)
(Continued)

(52) U.S. Cl.
CPC .......... *H01L 29/407* (2013.01); *H01L 29/401* (2013.01); *H01L 29/404* (2013.01);
(Continued)

(58) Field of Classification Search
CPC ............................ H01L 29/407; H01L 29/404
See application file for complete search history.

(56) References Cited

U.S. PATENT DOCUMENTS 5,618,751 A * 4/1997 Golden ............. H01L 27/10861
257/E21.651
8,748,976 B1 * 6/2014 Kocon ................... H01L 29/404
257/330
(Continued)

FOREIGN PATENT DOCUMENTS

CN    104051461 A    9/2014
CN    107710418 A    2/2018

OTHER PUBLICATIONS

Patent Cooperation Treaty Search Report, dated Dec. 24, 2018, PCT/CN2018/079803.

*Primary Examiner* — Alia Sabur
(74) *Attorney, Agent, or Firm* — Andrew R. Ralston; Charles A. Brill; Frank D. Cimino

(57) ABSTRACT

A semiconductor device includes a substrate including a semiconductor surface layer. A field plate (FP) includes a trench in the semiconductor surface layer filled with a single polysilicon layer positioned on at least one side of a power metal-oxide-semiconductor field effect transistor (power MOSFET). The power MOSFET includes a dielectric liner lining a sidewall of the trench under the polysilicon layer including a second dielectric liner on a first dielectric liner. An upper portion of the dielectric liner has a lower dielectric thickness as compared to a dielectric thickness on its lower portion. The single polysilicon layer extends continuously over the dielectric liner along both the lower portion and the upper portion. The power MOSFET includes a drain including a drain contact below a vertical drift region in the semiconductor surface layer, and a gate, body and a source above the vertical drift region.

18 Claims, 11 Drawing Sheets

(51) Int. Cl.
*H01L 29/66* (2006.01)
*H01L 21/311* (2006.01)
*H01L 21/28* (2006.01)

(52) U.S. Cl.
CPC .... *H01L 29/66734* (2013.01); *H01L 29/7813* (2013.01); *H01L 21/28035* (2013.01); *H01L 21/28194* (2013.01); *H01L 21/31111* (2013.01); *H01L 21/31116* (2013.01)

(56) References Cited

U.S. PATENT DOCUMENTS

2010/0264486 A1\* 10/2010 Denison ............ H01L 29/42368
257/330
2015/0357461 A1 12/2015 Kawahara et al.

\* cited by examiner

SEMICONDUCTOR DEVICE HAVING POLYSILICON FIELD PLATE FOR POWER MOSFETS

FIELD

This Disclosure relates to power semiconductor devices having field plates.

BACKGROUND

Some power metal oxide semiconductor field effect transistors (MOSFETs) may be vertical devices that have a drain below a vertical drift region with a back side contact, a gate, a body, and a source above the vertical drift region. There may be vertical trenches in the semiconductor material that is typically silicon, that have polysilicon filler therein on opposite sides of the vertical drift region of the MOSFET known as field plates, that may also be referred to elsewhere as RESURF trenches. The field plates contain a dielectric trench liner on sidewalls of the semiconductor.

The power MOSFET can be configured as a planar gate structure formed above the semiconductor surface similar to a conventional MOSFET. Alternatively, the power MOSFET can configured as a trench gate structure where a second polysilicon gate sits on top of polysilicon inside a gate trench etched in the semiconductor material such as silicon. In this power MOSFET structure, also called a trench-MOS, the gate electrode is buried in the gate trench.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a semiconductor device comprising a substrate including a semiconductor surface layer, with a field plate (FP) including a trench in the semiconductor surface layer filled with a single polysilicon layer positioned on at least one side of a power MOSFET. The FP includes a dielectric liner lining a sidewall of the trench under the polysilicon layer including a second dielectric liner layer on a first dielectric liner layer. An upper portion of the dielectric liner has a lower thickness as compared to a thickness on the lower portion. The single polysilicon layer extends continuously over the dielectric liner along both the upper portion and the lower portion. The power MOSFET includes a drain including a drain contact below a vertical drift region in the semiconductor surface layer, a gate, a body, and a source above the vertical drift region.

BRIEF DESCRIPTION OF THE DRAWINGS

Reference will now be made to the accompanying drawings, which are not necessarily drawn to scale, wherein.

DETAILED DESCRIPTION

Figure 1A:
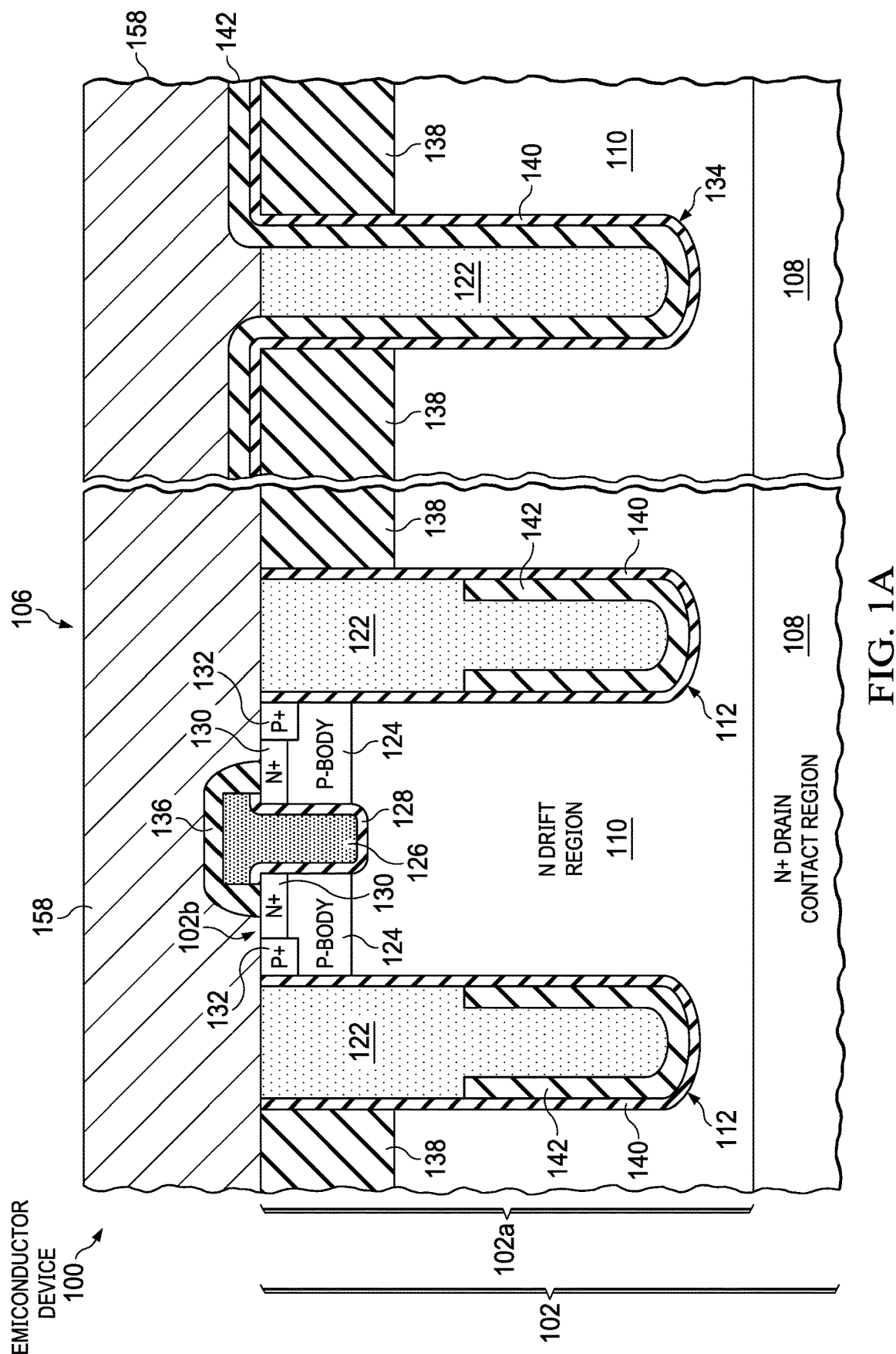
FIG. 1A is a cross section of a semiconductor device including an example vertical trench gate MOS transistor including at least one FP, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed methods simplify the process integration to form polysilicon filled FPs for semiconductor devices comprising a vertical or a planar gate MOS transistor including at least one FP that generally has required 2 polysilicon depositions, with only a single polysilicon deposition and etch back process. After trench liner oxide growth and silicon oxide deposition, photoresist (PR) is coated into FP trench and exposure or development is performed to remove about the top-half of the PR in this trench. An etch back removes the deposited silicon oxide layer, where the PR in the trench protects the deposited silicon oxide layer in roughly the bottom half of the trench. As a result, the liner thickness on the lower portion of the FP trench is at least 50% thicker as compared to the liner thickness at the upper portion of FP trench. The subsequent processing comprises PR removal, polysilicon deposition, and then polysilicon etch back to complete the FP.

FIG. 1A is a cross sectional depiction of a semiconductor device 100 including an example vertical trench gate MOS transistor 106 shown as an NMOS transistor that includes FPs. FPs often function to reduce an electric field in an adjacent semiconductor region. A FP may be for example a semiconductor region with an opposite conductivity type from the adjacent semiconductor region. Although NMOS transistors are described herein, it should be clear to one having ordinary skill in the art to use the information in this Disclosure to also form PMOS transistors, by n-doped regions being substituted by p-doping and vice versa so that examples aspects also include p-channel vertical MOS transistors. In addition, the particular layout of the trench gate MOS transistor 106 shown in FIG. 1A is only an example layout.

The semiconductor device 100 is formed in and on a substrate 102 which includes a semiconductor surface layer 102a that extends to a top surface 102b. The vertical trench gate MOS transistor 106 includes an n-type drain contact region 108 shown as an "N+ drain contact region" disposed in the substrate 102 below an n-type vertical drift region 110. The vertical MOS transistor 106 includes at least one FP 112 and may include an optional auxiliary FP 134 that is used for termination. Termination is a feature designed for the outer edge of the device (e.g., on a die) to ensure the device is terminated so that when voltage is applied to the device the device does not experience a voltage breakdown prematurely (at a lower voltage level) occurring at its outer edge. An instance of the FP 112 is shown disposed on opposite sides of an n-type vertical drift region 110, extending to near the top surface 102b of the semiconductor surface layer 102a. The instances of the FP 112 adjacent to the vertical drift region 110 may be portions of a single FP 112, or may be separate FPs.

Each FP 112 has a dielectric liner that lines a sidewall of its trench under a single polysilicon layer 122, where the dielectric liner comprises a second dielectric liner layer 142 on a first dielectric liner layer 140. The second dielectric liner layer 142 can comprise a deposited silicon oxide layer and the first dielectric liner layer 140 can comprise a thermally grown silicon oxide layer. As known in the art, a thermally grown silicon oxide is known to have a higher density and thus a lower etch rate as compared to a deposited silicon oxide layer even after densification of the deposited oxide layer. An upper portion of the dielectric liner can be seen to have a lower dielectric thickness (for example due to being the first dielectric liner layer 140 alone) as compared to a dielectric liner thickness on a lower portion of the FP 112 having the second dielectric liner layer 142 on the first dielectric liner layer 140. The single polysilicon layer 122 extends continuously over the dielectric liner along both the lower portion and the upper liner portion.

The vertical MOS transistor 106 includes a gate electrode (gate) 126 disposed on a gate dielectric layer 128 contacting the p-body region 124. In the instant example, the gate 126 is a trench gate, as depicted in FIG. 1A. Other gate configurations, for example planar gates, are within the scope of this Disclosure, and a planar gate transistor is described below relative to FIG. 1B. The gate 126 is laterally separated from each adjacent FP 112 by the semiconductor material of the substrate 102. The gate 126 can also be formed in the same trench above the FP 112 separated by the gate dielectric 128.

An n-type source region 130 shown doped N+ is disposed abutting the gate dielectric layer 128 and the p-body region 124 is opposite from the vertical drift region 110. A p-type body contact region 132 extends from the top surface 102b of the surface layer 102a to the p-body region 124. A source electrode 158 that generally comprises a metal layer is electrically coupled to the source region 130, to the p-body contact region 132, to the single polysilicon layer 122 in the FPs 112, and also to the single polysilicon layer 122 also shown in the auxiliary FP 134.

The source electrode 158 may be directly electrically coupled to a top surface of the single polysilicon layer 122 as depicted in FIG. 1A. The gate 126 is electrically isolated from the source electrode 158, for example by the dielectric gate cap layer 136 shown. The vertical MOS transistor 106 may be laterally isolated from other circuitry in the semiconductor device 100, for example by optional field oxide 138. The field oxide 138 may be formed by a shallow trench isolation (STI) process which is shown in FIG. 1A, or by a local oxidation of silicon (LOCOS) process.

In one version of the instant example, in which the vertical MOS transistor 106 is designed to operate up to 40 volts, the FP 112 may be 2.2 microns to 2.8 microns deep and 600 nanometers to 800 nanometers wide. The second dielectric liner layer 142 may be 80 to 500 nanometers thick as deposited, and the first dielectric liner layer 140 may be 50 to 300 nanometers thick as deposited. The single polysilicon layer 122 may be doped n-type and may have an average doping density of $1 \times 10^{18}$ cm$^{-3}$ to $1 \times 10^{20}$ cm$^{-3}$. The vertical drift region 110 may be 2.0 microns to 2.6 microns wide and have an average doping density of $6.0 \times 10^{16}$ cm$^{-3}$ to $1.2 \times 10^{17}$ cm$^{-3}$.

In another version of the instant example in which the vertical MOS transistor 106 is designed to operate up to 100 volts, the FP 112 may be 6 microns to 7 microns deep and 1.2 microns to 1.4 microns wide. The second dielectric liner layer 142 may be 200 to 300 nanometers thick and the first dielectric liner layer 140 may be 150 to 200 nanometers thick. The single polysilicon layer 122 may be doped n-type and may have an average doping density of $1 \times 10^{18}$ cm$^{-3}$. The vertical drift region 110 may be 2.0 microns to 2.4 microns wide, and have an average doping density of $4 \times 10^{16}$ cm$^{-3}$ to $6 \times 10^{16}$ cm$^{-3}$.

In a further version of the instant example in which the vertical MOS transistor 106 is designed to operate up to 250 volts, the FP 112 may be 13 microns to 17 microns deep and 2.5 microns to 2.8 microns wide. The second dielectric liner layer 142 may be 300 to 500 nanometers thick and the first dielectric liner layer 140 may be 200 to 300 nanometers thick. The single polysilicon layer 122 may be doped n-type and may have an average doping density of $1 \times 10^{18}$ cm$^{-3}$ to $1 \times 10^{20}$ cm$^{-3}$. The vertical drift region 110 may be 2.3 microns to 2.7 microns wide, and have an average doping density of $1.0 \times 10^{16}$ cm$^{-3}$ to $3.0 \times 10^{16}$ cm$^{-3}$.

Figure 1B:
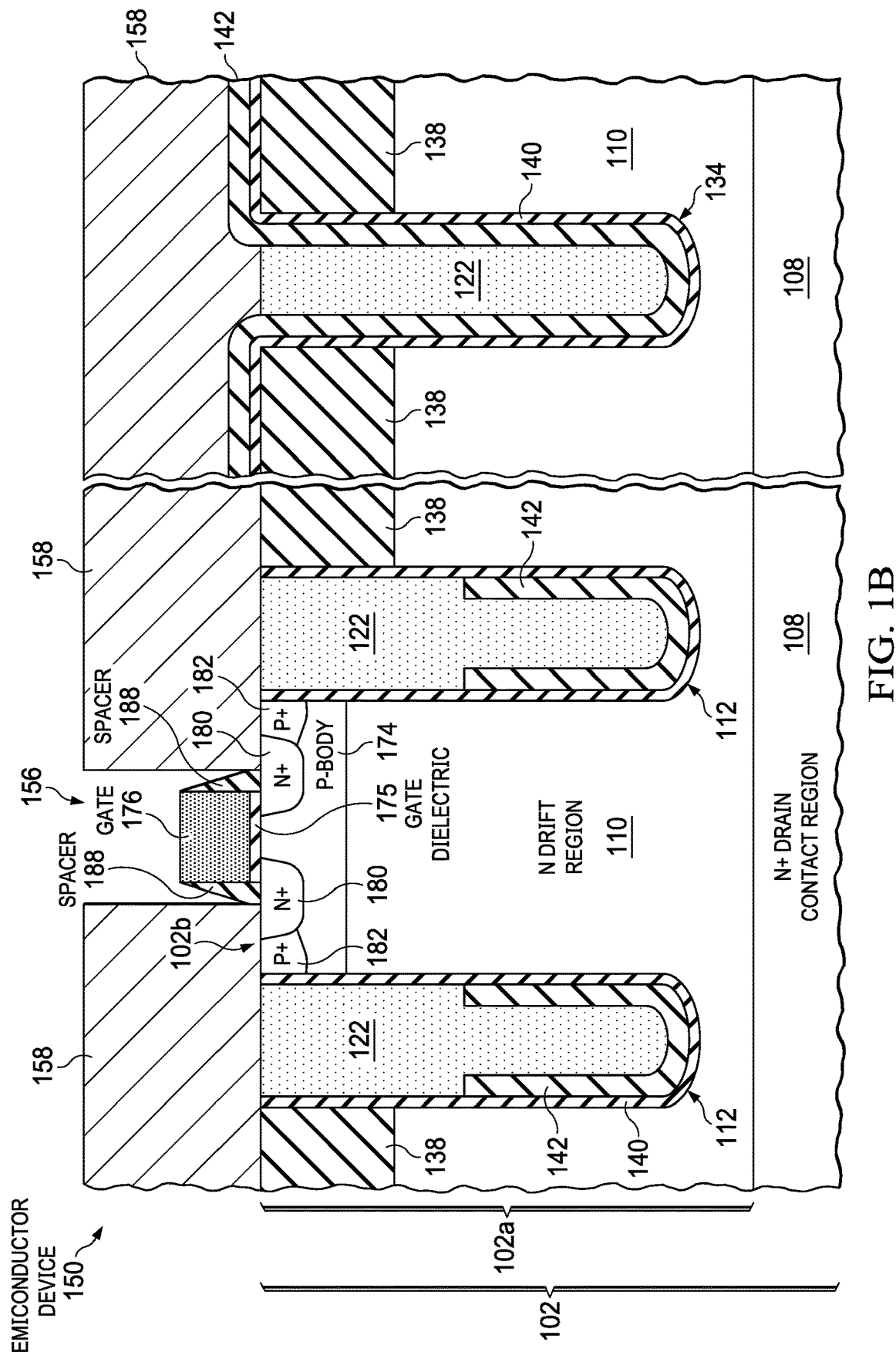
FIG. 1B is a cross section of a semiconductor device including an example planar gate MOS transistor including at least one FP, according to an example aspect.

FIG. 1B is a cross section of a semiconductor device 150 containing an example planar gate MOS transistor 156 having FPs 112. The planar gate MOS transistor 156 includes a gate 176 (e.g., a polysilicon gate) with sidewall spacer 188, gate dielectric 175, spacer 188, source 180, p-body 174 and p+ body contacts 182. The FPs 112 and auxiliary FP 134 are the same as shown in FIG. 1A described above.

Figure 2A:
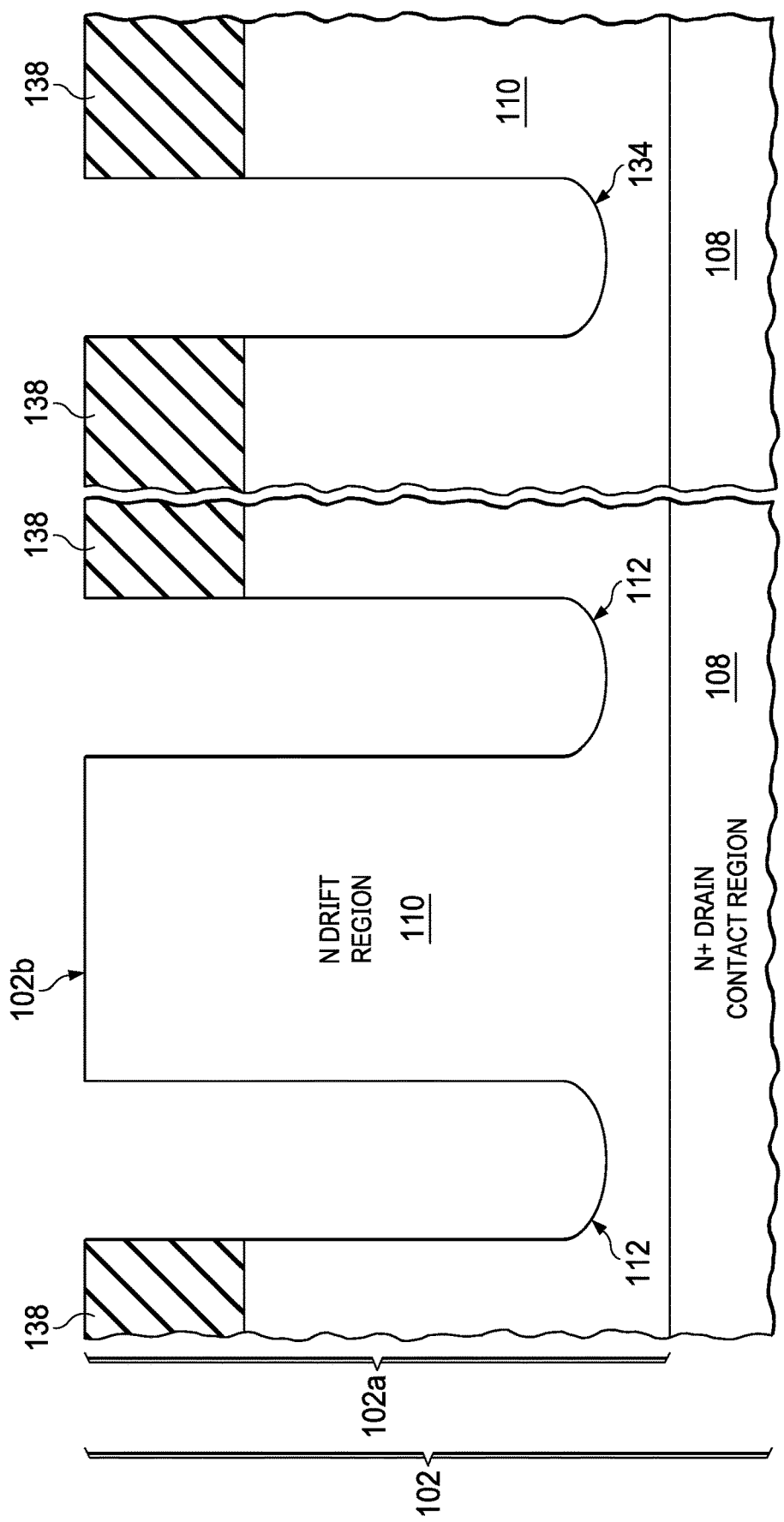
FIGS. 2A-2I are cross-sectional diagrams showing processing progression for an example method of forming a semiconductor device containing the vertical trench gate MOS transistor including at least one FP shown in FIG. 1A, according to an example aspect.

FIG. 2A through FIG. 2I are cross-sectional diagrams showing processing progression for an example method of forming the semiconductor device 100 containing the vertical trench gate MOS transistor 106 including at least one FP 112 shown in FIG. 1A, depicted in successive stages of fabrication. Referring to FIG. 2A, the in-process semiconductor device is formed in and on a substrate 102 which includes a semiconductor surface layer 102a extending to a top surface 102b. The vertical MOS transistor 106 includes an n+ drain contact region 108 disposed in the substrate 102 below a vertical drift region 110 doped n−. Field oxide elements 138 are shown at the top surface 102b of the semiconductor surface layer 102a.

Trenches for FPs 112 are shown formed in the substrate 102 on at least two opposite sides of the vertical drift region 110. A trench for at least one auxiliary FP 134 is formed in the substrate 102 proximate to the vertical MOS transistor 106, which can be formed concurrently with the FPs 112. The trench for the FPs 112 and the trench for the auxiliary FP 134 may be formed, for example, by forming a hard mask layer of 250 nanometers to 450 nanometers of silicon dioxide and/or silicon nitride over the top surface 102b of the semiconductor surface layer 102a, forming an etch mask of photoresist over the hard mask layer which exposes the hard mask layer in areas for the trenches of the FPs and the trench for the auxiliary FP 134, and removing the hard mask layer in the exposed areas.

Semiconductor material is subsequently removed from the semiconductor surface layer 102a in the areas exposed by the hard mask layer for the FPs 112 and the auxiliary FP 134. The semiconductor material may be removed from the semiconductor surface layer 102a using a timed reactive ion etch (ME) process to attain a desired depth of the trenches for the FPs 112 and for the trenches of the auxiliary FP 134.

The photoresist in the etch mask areas may be removed by the resist develop process. The hard mask layer and any remaining photoresist may be removed after the trenches for the FP 112 and the trenches for the auxiliary FP 134 are formed.

Figure 2B:
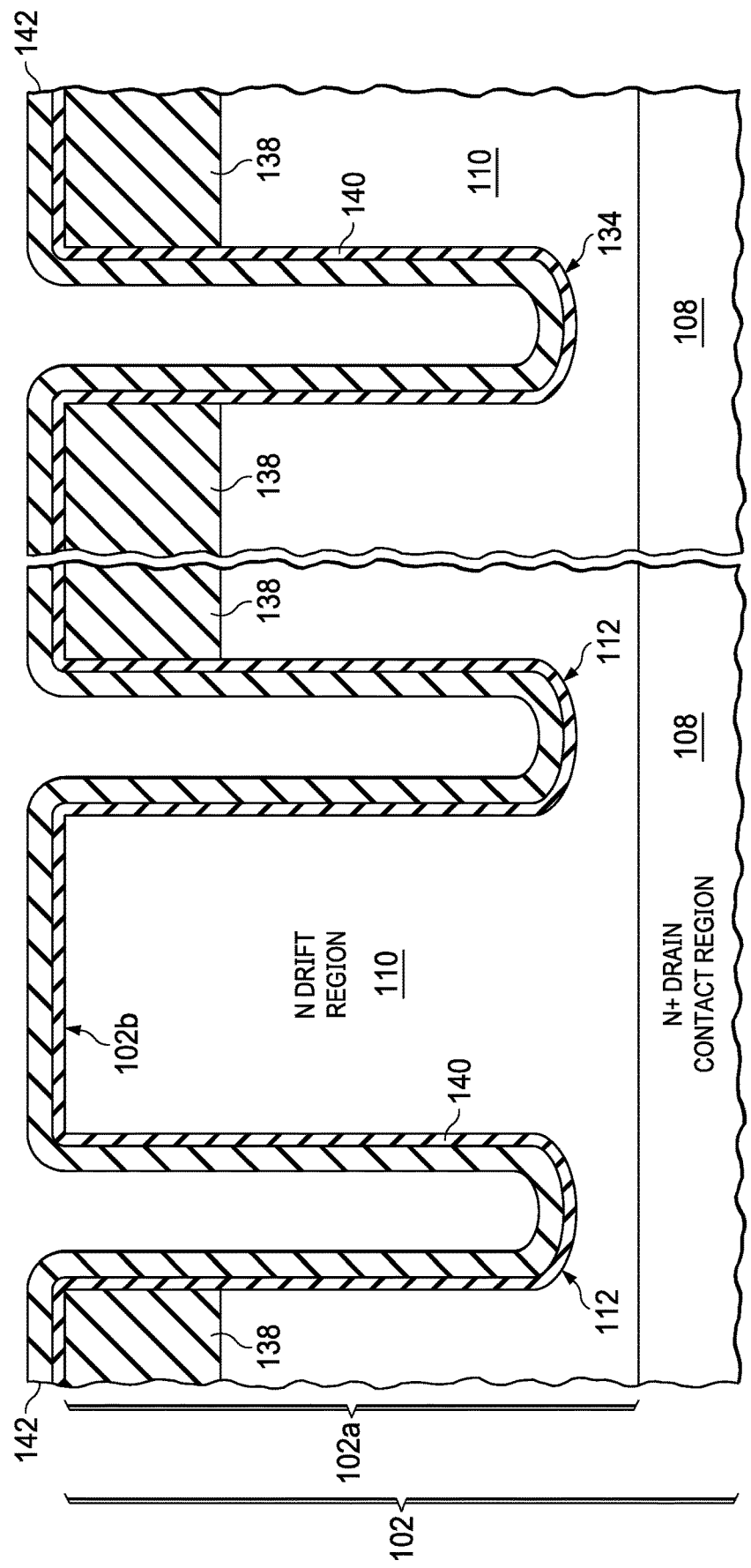

FIG. 2B shows the in-process semiconductor device after a first dielectric layer 140 that generally comprises a thermal oxide layer is formed at sidewalls and on a bottom of the trenches of the FP 112 and the auxiliary FP 134, and possibly at the top surface 102b of the semiconductor surface layer 102a. As described above, the first thermal oxide layer 140 may be 50 to 300 nanometers thick, such as being 80 nanometers to 150 nanometers thick. A second dielectric layer 142 generally comprising a deposited silicon dioxide layer is formed on first dielectric layer 140 which as described above may be as deposited 80 nanometers to 500 nanometers thick, such as being 80 nanometers to 200 nanometers thick, or 150 nanometers to 200 nanometers thick. The second dielectric layer 142 may be formed by a sub-atmospheric chemical vapor deposition (SACVD) process using dichlorosilane and oxygen. Alternately, the second dielectric layer 142 may be formed by a plasma enhanced chemical vapor deposition (PECVD) process using tetraethyl orthosilicate, also known as tetraethoxysilane (or TEOS). The second dielectric layer 142 may be subsequently densified in an anneal step.

Figure 2C:
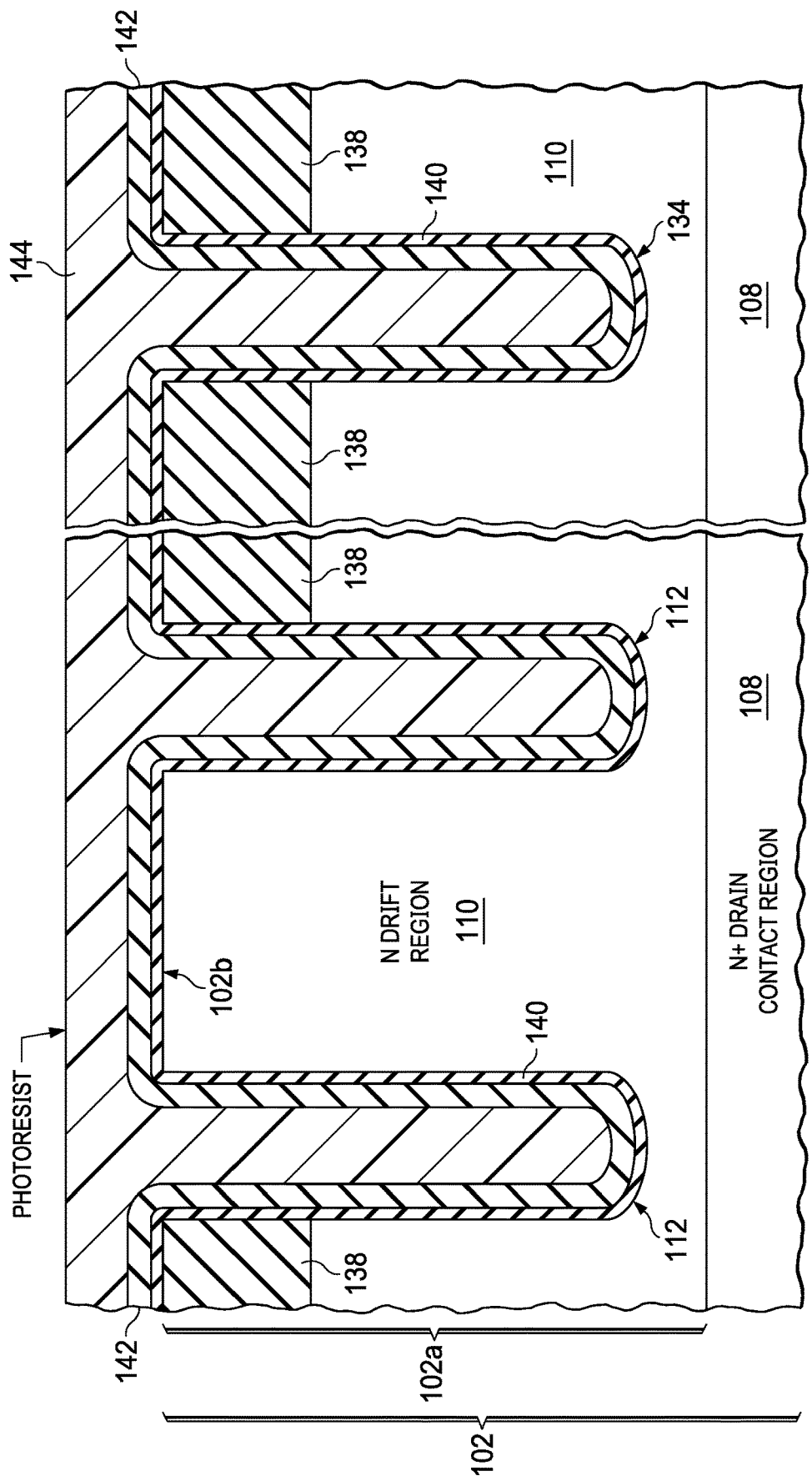
Figure 2D:
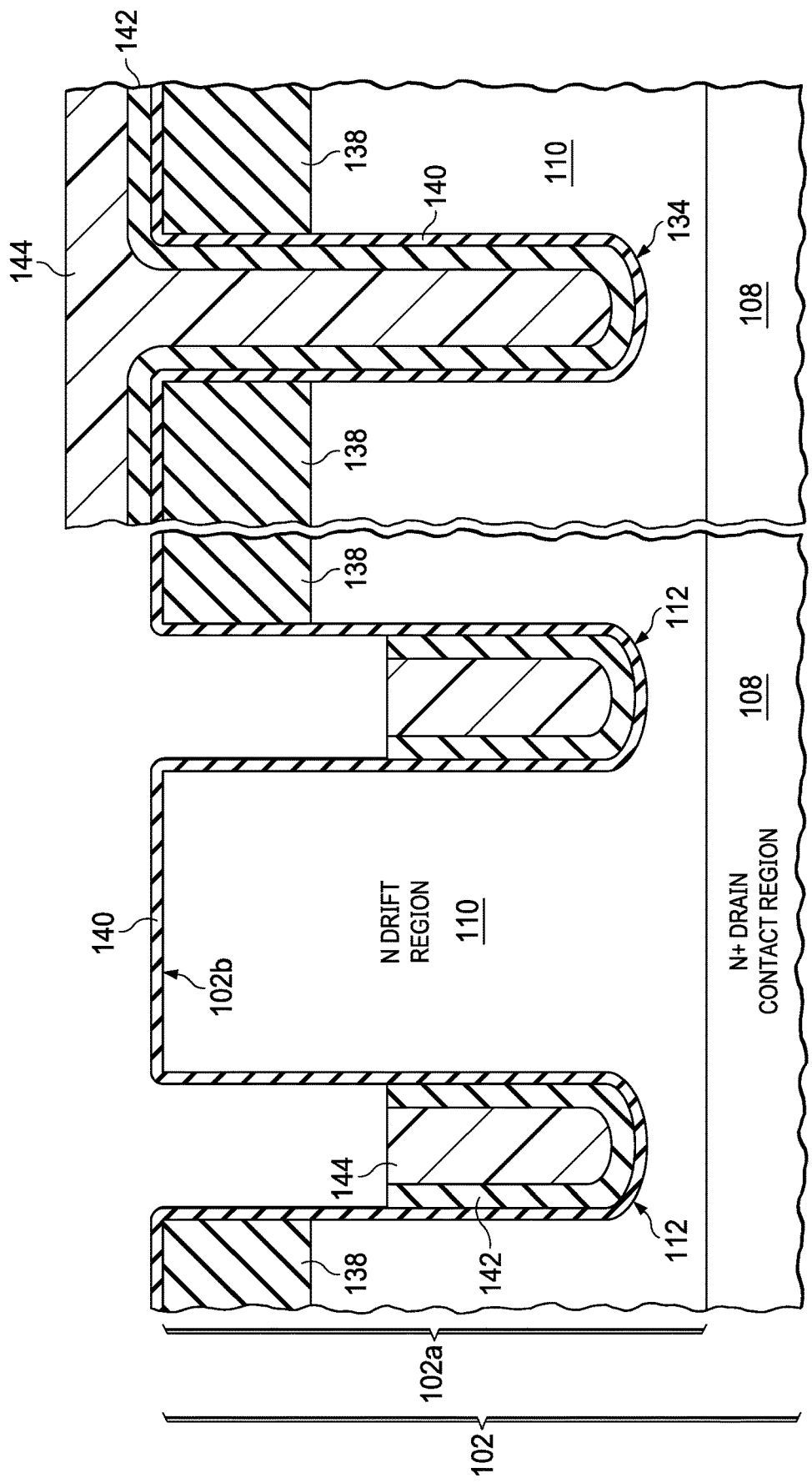

FIG. 2C shows the in-process semiconductor device after coating the substrate with photoresist (PR) 144 including filling the FP trenches with PR 144. FIG. 2D shows the in-process semiconductor device after exposing the PR 144 with a mask and then partially removing the PR 144 so that the PR 144 is removed in an upper portion of the trenches of the FPs 112, while not removing the PR 144 over the auxiliary FP 134, then etching the upper portion of the trench liners of the FP 112 to remove portions of the second dielectric liner layer 142. The etch may stop on the first dielectric liner layer 140. The lower portion of the second dielectric liner layer 142 and the first dielectric liner layer 140 are both protected during this etch by the PR 144.

The PR 144 can be a positive PR. As known in the art, in the case of a positive PR, the PR 144 is degraded by light and a developer will dissolve away the regions that were exposed to light, leaving behind a coating where the mask was placed.

The thickness of the PR 144 applied may be a function of the trench depth (and width or area) to ensure complete trench filling. After developing, PR 144 generally remains in 20% to 80% of the height/trench depth of the FPs 112, but is not removed in the axially trench 134. The target may be to leave 50%+/−10% of the height of PR 144 in the trenches of the FPs 112.

The etching of the upper portion of the trench liners for the FPs 112 can comprise a wet etch. The wet etch can comprise using a buffered hydrofluoric acid (HF) solution. An example buffered HF solution is 10 parts of 40 percent ammonium fluoride in deionized water and 1 part of 49 percent HF in deionized water. This example buffered HF etch exhibits an etch rate for densified SACVD silicon dioxide that is more than twice an etch rate for thermal oxide.

The etching of the upper portion of the trench liners can also comprise a dry etch. For dry etching the upper portion of the trench liners for the FPs 112, before etching the trenches shown in FIG. 2A, a dielectric stack comprising a bottom layer of silicon oxide, a layer of silicon nitride on the bottom layer, and a top layer of silicon oxide can be formed. The liner formation process can remain unchanged to that described above as well as the coating the semiconductor surface layer 102a with PR 144 including filling the FP trenches and then after exposing to partially remove the PR from the trenches of the FPs 112. An example dry etch for this purpose is a high selectivity carbon/fluorine-based plasma etch using an RF power of 1,200 W with 12 standard cubic centimeters per minute (sccm) $C_4F_8$, 5 sccm $O_2$, 100 sccm Ar, 95 sccm CO, using a 200 second etch time. The etch time used generally depends on the depth target. This plasma etch can provide an oxide etch rate (ER)/a silicon nitride ER of >10 and a silicon oxide ER/silicon ER of >10. This plasma etch can stop on silicon nitride and avoid silicon damage.

Figure 2E:
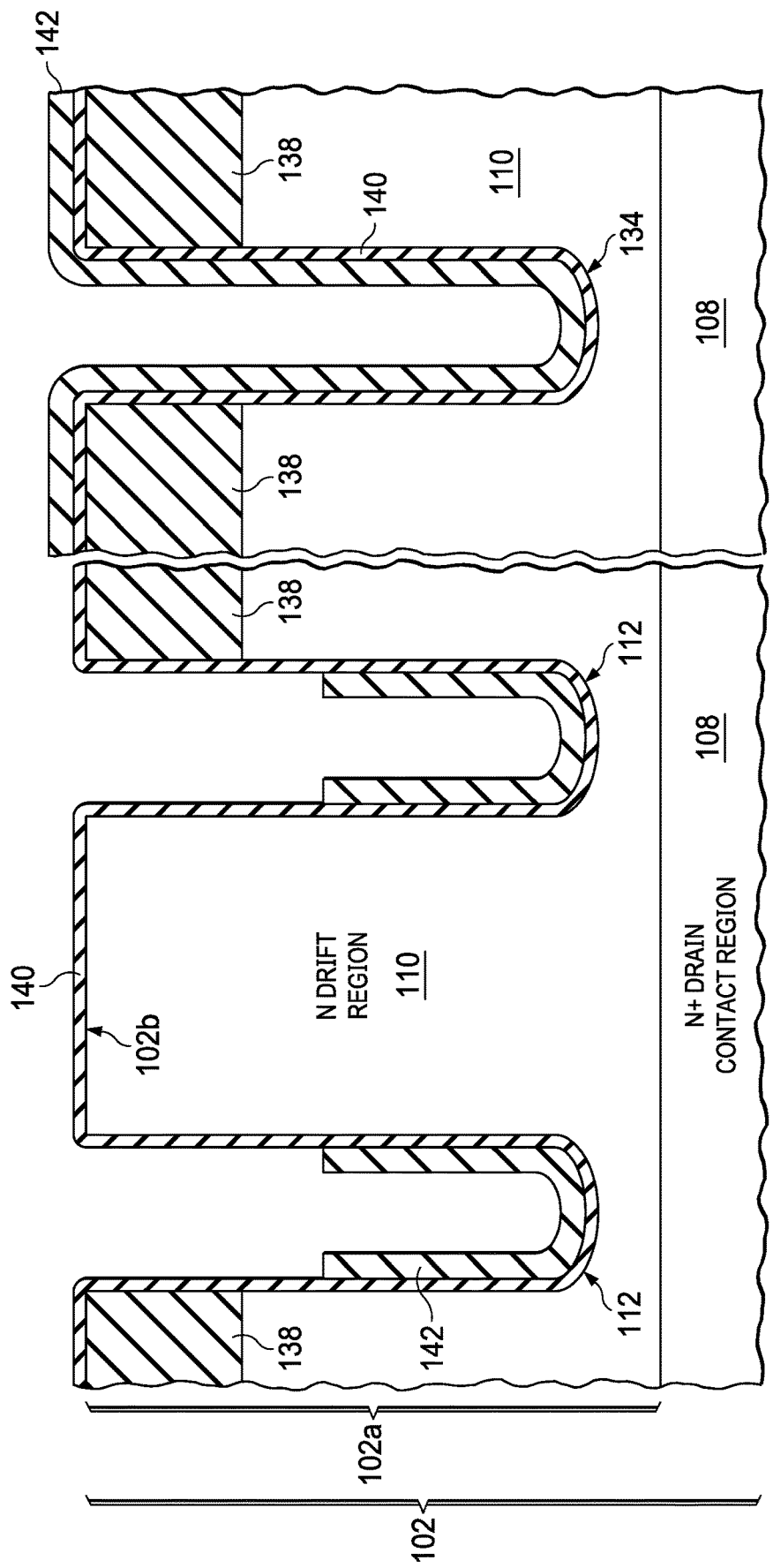
Figure 2F:
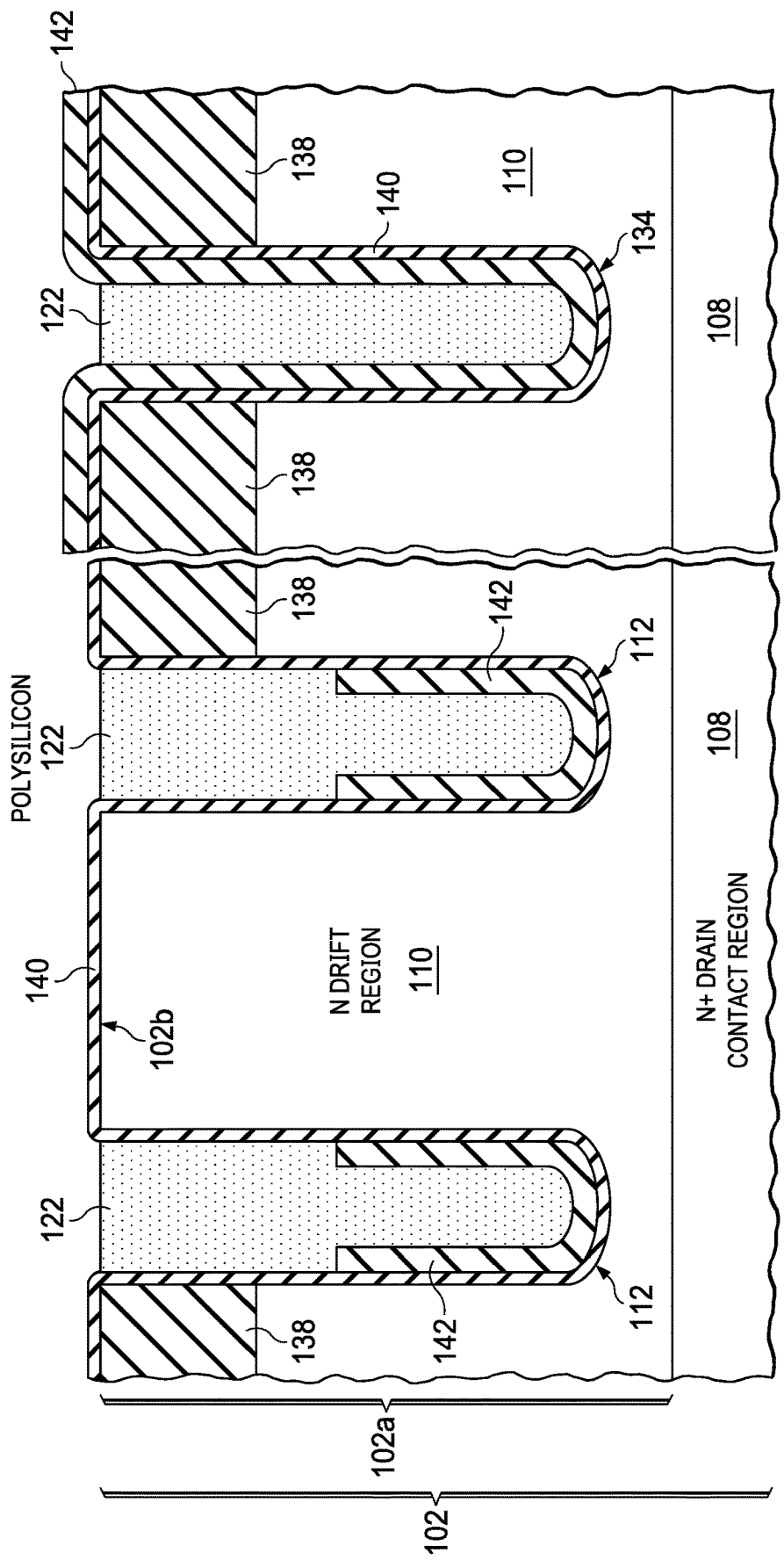

FIG. 2E shows the in-process semiconductor device after the PR 144 is stripped. FIG. 2F shows the in-process semiconductor device after depositing the single polysilicon layer 122 to fill the trenches for the FPs 112 and the trenches for the auxiliary FP 134, and then blanket etching back of the single polysilicon layer 122 to remove overburden regions. Chemical mechanical polishing (CMP) may be used for the polysilicon etch back.

The single polysilicon layer 122 may be for example, 500 nanometers to 700 nanometers thick over the top surface 102b as deposited. The single polysilicon layer 122 may be doped in-situ, for example with phosphorus, to have an average doping density of $1\times10^{18}$ $cm^{-3}$ to $5\times10^{18}$ $cm^{-3}$. Alternatively, the single polysilicon layer 122 may be doped by ion implanting dopants, for example phosphorus, at a dose of $1\times10^{14}$ $cm^{-2}$ to $1\times10^{16}$ $cm^{-2}$, and subsequent annealed at 900° C. to 1000° C. for 10 to 60 minutes.

Figure 2G:
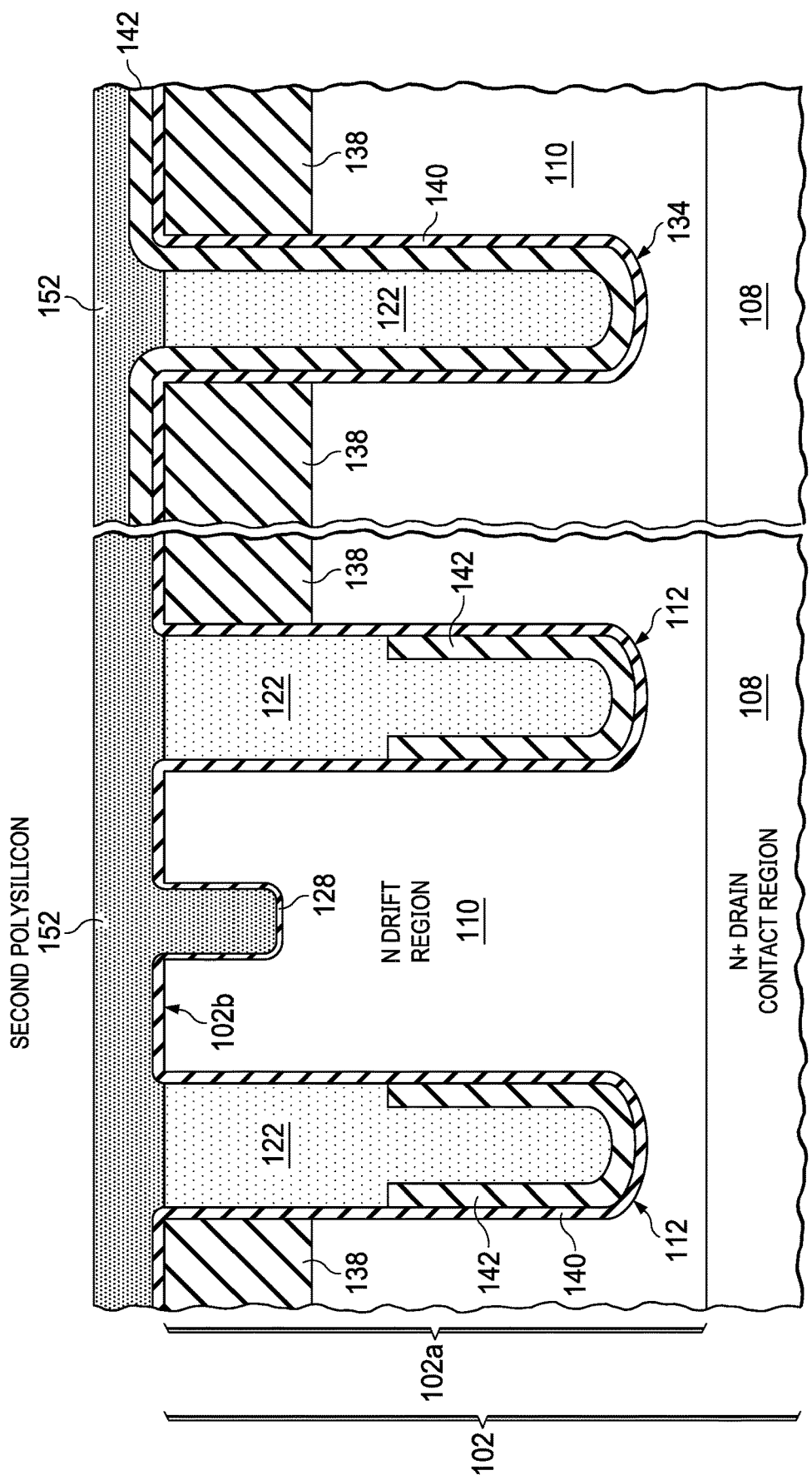

FIG. 2G shows the in-process semiconductor device after forming a gate trench in the semiconductor surface layer 102a between the FPs 112, forming a gate dielectric 128 (e.g., thermal oxide) to line the trench for the trench gate transistor, and then depositing a second polysilicon layer 152 that will be the gate electrode for the trench gate transistor. The second polysilicon layer 152 may be for example, 550 nanometers to 700 nanometers thick. The second polysilicon layer 152 may be doped, for example with phosphorus, during formation to have an average doping density of $1\times10^{18}$ $cm^{-3}$ to $5\times10^{18}$ $cm^{-3}$. Alternatively, the second polysilicon layer 152 may be doped by ion implanting dopants, for example phosphorus, at a dose of $1\times10^{14}$ $cm^{-2}$ to $1\times10^{16}$ $cm^{-2}$, and be subsequent annealed at 900° C. to 1000° C. for 20 to 60 minutes.

Figure 2H:
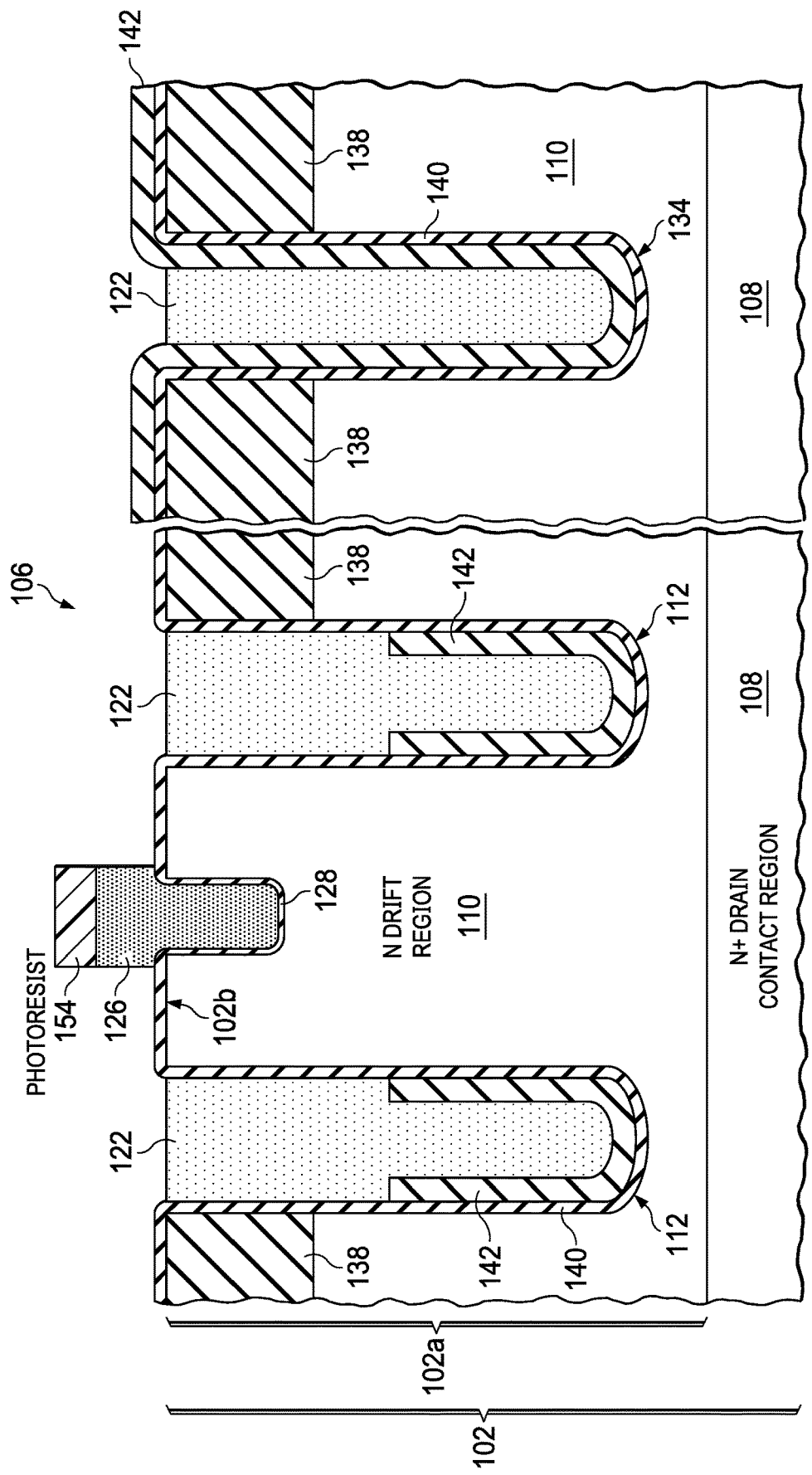

FIG. 2H shows the in-process semiconductor device after a patterned etch of the second polysilicon layer 152 to form a gate 126 that is a trench gate on the gate dielectric 128, with the patterned gate etch mask 154 shown over the gate 126. A gate etch process removes the second polysilicon layer 152 exposed by the gate etch mask 154 to form the gate 126 of the vertical trench gate MOS transistor 106. After the gate etch process is completed, a top surface of the second polysilicon layer in the trenches of the FPs 112 are approximately coplanar, for example within 200 nanometers, with the top surface 102b of the semiconductor surface layer 102a.

Figure 2I:
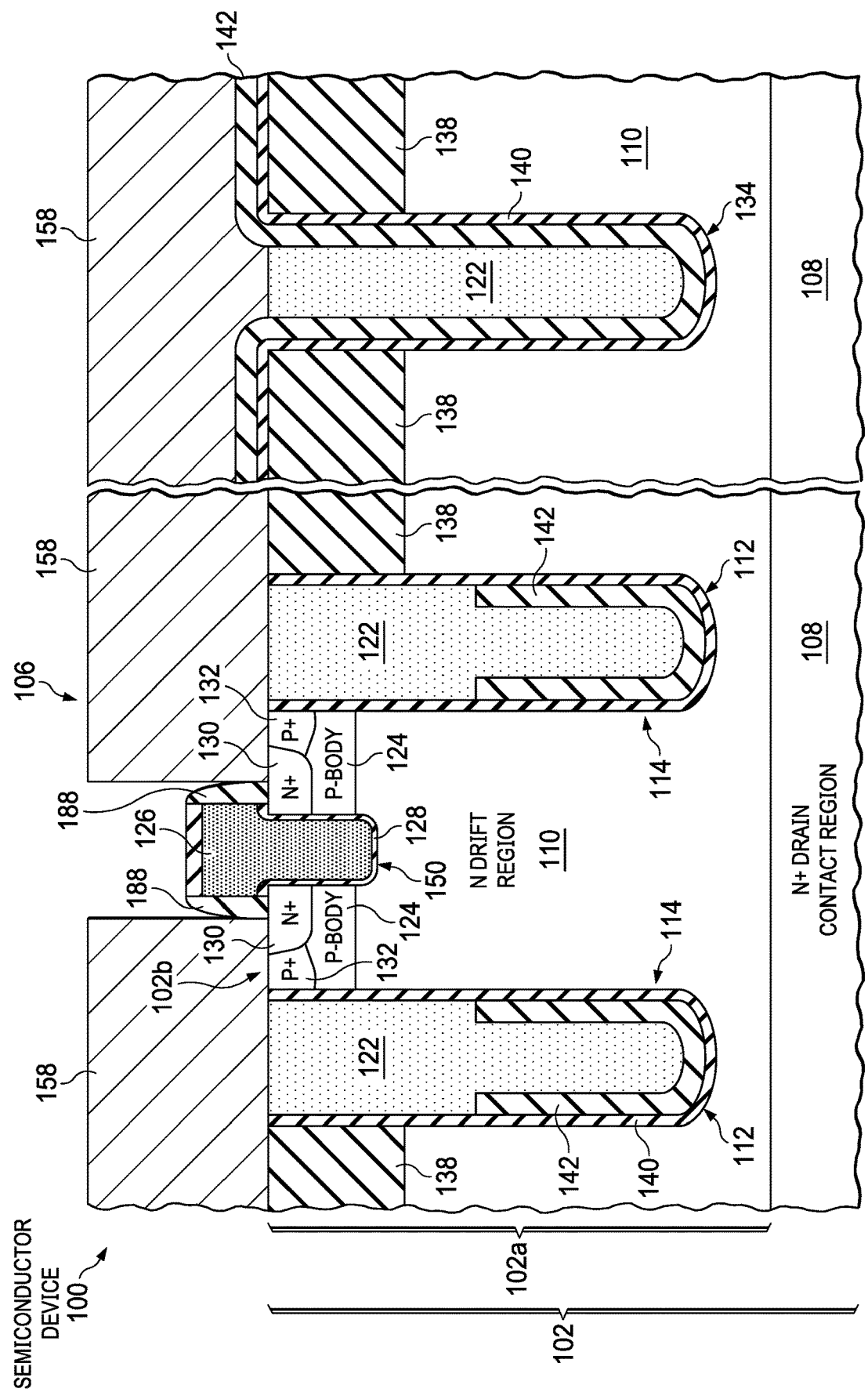

FIG. 2I shows the in-process semiconductor device after stripping the patterned gate etch mask 154 shown as photoresist, a p-type body region 124 is formed in the semiconductor surface layer 102a abutting the gate trench. An n+ source region 130 is formed in the semiconductor surface layer 102a abutting the gate trench opposite from the vertical drift region 110. P+ body contact regions 132 may optionally be formed in the p-body region 124 at the top surface 102b of the semiconductor surface layer 102a, and a source electrode 158 is formed over the semiconductor surface layer 102a so as to make electrical contact to the source region 130 and to the p-body region 124 (through the p+ body contact regions 132 if present).

The source electrode 158 further makes electrical contact to the single polysilicon layer 122 in the FPs 112, and to the single polysilicon layer 122 in the auxiliary FP 134. The source electrode 158 may include a contact metal layer of one or more layers of titanium and titanium nitride or tantalum nitride. The source electrode 158 may further include a layer of aluminum or copper, for example 1 to 5 microns thick, on the contact metal layer.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating a semiconductor device, comprising:
    forming a first trench for a field plate (FP) in a semiconductor layer of a substrate;
    forming a second trench adjacent the first trench;
    forming a dielectric liner in the trenches;
    forming photoresist over the substrate including over the dielectric liner within the trenches;
    exposing the photoresist in the first trench, the photoresist in the second trench remaining unexposed;
    developing the photoresist to remove the photoresist in an upper portion of the first trench so that the photoresist remains in a lower portion of the first trench, the photoresist in the second trench remaining undeveloped;
    etching the dielectric liner in the upper portion of the first trench while the dielectric liner layer in the lower portion of the first trench and in the entire second trench is protected by the photoresist;
    removing the photoresist from the first and second trenches; and
    filling the trenches with polysilicon.

2. The method of claim 1, wherein the dielectric liner includes a thermally grown silicon oxide layer underlying a sub-atmospheric chemical vapor deposition (SACVD) deposited silicon dioxide layer, and wherein the dielectric liner in the lower portion of the trench is at least 50% thicker as compared to a the dielectric liner in the upper portion of the trench after etching the dielectric liner.

3. The method of claim 1, further comprising forming a power metal-oxide-semiconductor field effect transistor (power MOSFET) adjacent to the FP, the power MOSFET including a vertical drift region in the semiconductor surface layer above a drain, and further including a drain contact, a gate, a body, and a source above the vertical drift region.

4. A method of fabricating a semiconductor device, comprising:
    forming a trench for a field plate (FP) in a semiconductor surface layer of a substrate;
    dielectric lining the trench with a dielectric liner including a first dielectric liner layer and then depositing a second dielectric liner layer on the first dielectric liner layer;
    coating the substrate with photoresist (PR) including filling the trench;
    exposing and then developing the PR to remove the PR in an upper portion of the trench so that the PR remains in a lower portion of the trench;
    etching to remove the second dielectric liner layer in the upper portion of the trench, wherein the second dielectric liner layer and the first dielectric liner layer in the lower portion of the trench are both protected by the PR;
    stripping the PR;
    filling the trench by depositing a single polysilicon layer, and
    forming a power metal-oxide-semiconductor field effect transistor (power MOSFET) adjacent to the FP, the power MOSFET including a vertical drift region in the semiconductor surface layer above a drain including a drain contact, a gate, a body, and a source above the vertical drift region,
    wherein the forming the trench further comprises forming an auxiliary trench for an auxiliary FP, wherein the auxiliary trench is disposed in the semiconductor surface layer lateral to the FP, is filled with the photoresist by the coating, wherein the exposing and then developing does not remove the PR in the auxiliary trench, and auxiliary trench is filled with polysilicon by the depositing the single polysilicon layer.

5. The method of claim 4, wherein the second dielectric liner layer has a lower density as compared to the first dielectric liner layer.

6. The method of claim 5, wherein the first dielectric liner layer comprises a thermally grown silicon oxide layer and wherein the second dielectric liner layer comprises a sub-atmospheric chemical vapor deposition (SACVD) deposited silicon dioxide layer, and wherein the dielectric liner in the lower portion of the trench is at least 50% thicker as compared to a thickness of the dielectric liner in the upper portion of the trench.

7. The method of claim 4, wherein the power MOSFET comprises a trench gate MOSFET.

8. The method of claim 4, wherein the power MOSFET comprises a planar gate MOSFET.

9. The method of claim 4, wherein the developing removes 20% to 80% of a height of the PR in the trench.

10. The method of claim 9, wherein the developing removes 40% to 60% of the height of the PR in the trench.

11. The method of claim 4, wherein the FP comprises a first FP and a second FP on opposite sides of the power MOSFET.

12. The method of claim 4, wherein after the depositing the first dielectric liner layer is 50 nm to 300 nm and the second dielectric liner layer is 80 nm to 500 nm.

13. The method of claim 4, further comprising forming a source electrode comprising a metal coupled to the source and to the single polysilicon layer in the FP, and to the single polysilicon layer in the auxiliary trench.

14. A method of fabricating a semiconductor device, comprising:
    forming a first trench and a second trench in a semiconductor layer of a substrate;

forming a dielectric liner over sidewall surfaces in the trenches;
filling the trenches with photoresist;
removing a portion of the photoresist within the second trench, thereby exposing the dielectric liner at a top section of the second trench;
removing a portion of the dielectric liner in the top section of the second trench, an entirety of the dielectric liner in the first trench being protected by photoresist;
removing the photoresist in the first trench and a remaining portion of the photoresist in the second trench; and
filling the first and second trench with polysilicon.

15. The method of claim 14, wherein the dielectric liner includes a first oxide layer formed by thermal oxidation and a second oxide layer formed by chemical vapor deposition.

16. The method of claim 15, wherein the first oxide layer has a thickness in a range between about is 50 nm and about 300 nm, and the second oxide layer has a thickness in a range between about 80 nm and about 500 nm.

17. The method of claim 14, wherein the removing a portion of the photoresist removes 20% to 80% of a height of the photoresist in the trench.

18. The method of claim 14, wherein the removing a portion of the photoresist removes 40% to 60% of the height of the photoresist in the trench.

* * * * *